United States Patent
Kalyandurg

(10) Patent No.: US 7,072,184 B2
(45) Date of Patent: Jul. 4, 2006

(54) HEAT SINK ATTACHMENT

(75) Inventor: Satyan Kalyandurg, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 10/955,080

(22) Filed: Sep. 30, 2004

(65) Prior Publication Data

US 2005/0264999 A1    Dec. 1, 2005

Related U.S. Application Data

(62) Division of application No. 10/210,681, filed on Aug. 1, 2002, now Pat. No. 6,816,375.

(60) Provisional application No. 60/310,439, filed on Aug. 3, 2001.

(51) Int. Cl.
    *H05K 7/20* (2006.01)
(52) U.S. Cl. ............. 361/704; 361/707; 361/709; 359/634; 353/60; 353/119; 349/161; 315/32
(58) Field of Classification Search ........ 361/702–719, 361/686, 687; 359/634, 638, 631, 640, 819, 359/823, 822, 833, 836, 1.52, 224, 237; 353/33, 353/81, 56–61, 119, 122, 123; 356/19, 136, 356/137; 349/5, 8, 161; 165/80.2, 80.3, 165/185; 174/15.1, 16.3, 252, 253; 29/837; 348/335–339
See application file for complete search history.

(56) References Cited

U.S. PATENT DOCUMENTS

| | | | |
|---|---|---|---|
| 5,280,409 A | 1/1994 | Selna et al. | |
| 5,912,773 A * | 6/1999 | Barnett et al. | ............. 359/822 |
| 5,940,271 A | 8/1999 | Mertol | |
| 5,977,622 A | 11/1999 | Mertol | |
| 6,428,170 B1 * | 8/2002 | Haba | ............. 353/119 |
| 6,447,121 B1 * | 9/2002 | Woo | ............. 353/52 |
| 6,545,352 B1 | 4/2003 | Ruckdeschel | |
| 6,720,206 B1 * | 4/2004 | Choi | ............. 438/114 |
| 6,775,991 B1 * | 8/2004 | Evans et al. | ............. 62/3.2 |
| 6,814,445 B1 | 11/2004 | Kalyandurg et al. | |

OTHER PUBLICATIONS

An Article: "Microcircuit Heat Sink", IBM Technical Disclosure Bulletin, Mar. 1, 1966, p. 1457, vol. 8, Issue 10, United States.

* cited by examiner

*Primary Examiner*—Michael Datskovskiy
(74) *Attorney, Agent, or Firm*—Charles A. Brill; Wade James Brady, III; Frederick J. Telecky, Jr.

(57) ABSTRACT

A new heat sink apparatus and method that simplify the assembly of the heat sink and thermal stud. The new heat sink assembly uses a spring retainer that, in most cases, can use existing socket mounting screws. A spring clip (202) presses a thermal stud (204) against the back of an electrical device package (206). The present invention is especially useful for attaching a spatial light modulator to a printed circuit board (106) since it provides a simple, reliable heat sink without blocking the light path to and from the device. The preceding abstract is submitted with the understanding that it only will be used to assist in determining, from a cursory inspection, the nature and gist of the technical disclosure as described in 37 C.F.R. § 1.72(b). In no case should this abstract be used for interpreting the scope of any patent claims.

11 Claims, 5 Drawing Sheets

HEAT SINK ATTACHMENT

CROSS-REFERENCE TO RELATED APPLICATIONS

This application is a Divisional of application Ser. No. 10/210,681, filed Aug. 1, 2002 now U.S. Pat. No. 6,816,375 and Provisional Application No. 60/310,439, filed Aug. 3, 2001.

The following patents, and/or commonly assigned patent applications are hereby incorporated herein by reference:

| Patent No./ Serial No. | Filing Date | Publication No. | Publication Date | Issue Date | Title |
| --- | --- | --- | --- | --- | --- |
| 10/186,410 | Jul. 01, 2002 | 2003-0020882 | Jan. 30, 2003 | | DMD Heat Sink Socket Assembly |

FIELD OF THE INVENTION

This invention relates to the field of electronic assemblies, more particularly to thermal management in spatial light modulator display systems.

BACKGROUND OF THE INVENTION

Proper thermal dissipation is necessary to ensure reliable operation of many electronic devices. Many devices use heat sinks to allow thermal energy to be exhausted to either a cold wall or a cooling stream of air. Spatial light modulators, such as the digital micromirror device or DMD, provide unique thermal challenges. Not only does the electrical operation of the DMD create heat, the micromirrors absorb a portion of the intense beam of light focused on them, dramatically increasing the temperature of the micromirror device. Furthermore, the necessity of a free optical path to the surface of the micromirror array prevents the use of conventional heat sink methods.

A conventional DMD package and heat sink is shown in FIG. 1. In FIG. 1, the micromirror array typically is packaged in a ceramic or plastic substrate 102 sealed with a glass lid 104. Electrical connections between contacts on the rear surface of the micromirror package and a printed circuit board 106 are provided by an interposer 108. Several types of interposers 108 may be used. The interposer 108 may be an insulative resilient material having conductive portions in contact with the contacts on the micromirror package and electrical contacts on the printed circuit board. Alternatively, a plastic interposer 108 with metal spring contacts may be used. The DMD and interposer 108 are held in contact by a socket, not shown in FIG. 1, mounted over the DMD.

To remove heat from the DMD, an opening through the printed circuit board is used to allow a thermal stud 110 to contact the micromirror package substrate 102 from the back. A heat sink 112 is attached to the end of the thermal stud. The thermal stud 110 is epoxied to the back of the micromirror device using an epoxy patch 114. Another epoxy patch 116, or mechanical fasteners such as machine screws, are use to attach the heat sink 112 to the thermal stud 110. While this arrangement is quite effective to remove the heat from the micromirror package, it is difficult and expensive to produce.

The method used to attach the thermal stud to the package begins by inspecting the thermal stud 110 for defects, indentations, and sharp corners. The electrostatic integrity of the stud attachment fixture is then verified. The fixture pocket is cleaned, and then the micromirror package is loaded into the fixture pocket with the bottom surface up. The bonding surfaces of both the package and the stud are then wiped clean. An alignment plate is laced over the device in the stud attachment fixture. The thermal stud is placed on a hot plate to warm it. An epoxy patch is attached to the bonding surface of the thermal stud and the thermal stud is placed through the opening of the alignment plate and onto the micromirror device. A weight is then placed on the thermal stud and the epoxy patch is allowed to cure. When the epoxy patch has cured, the attachment is subjected to a shear force to verify the integrity of the attachment.

The process is not only labor intensive, it is also difficult to control. Due to inconsistencies from batch to batch of the epoxy patches and other process variations, the thermal stud attachment process often fails to achieve sufficient bond strength. If the bond fails the device must be scrapped because the thermal stud cannot be epoxied onto the micromirror a second time. An improved apparatus and method of extracting heat from the micromirror package is needed.

SUMMARY OF THE INVENTION

Objects and advantages will be obvious, and will in part appear hereinafter and will be accomplished by the present invention which provides a method and system for attaching a thermal stud to an electronic package. One embodiment of the present invention provides a method and apparatus for attaching a heat sink.

Another embodiment of the present invention provides a method of attaching a heat sink to an electronic device. The method comprises: providing an anchor surface having a first side and a second side; positioning an electronic device on the first side; placing a heat sink against the electronic device, the heat sink extending to the second side of the anchor surface; and retaining the heat sink against the electronic device using a spring clip.

Another embodiment of the present invention provides an electronic assembly comprising: an anchor surface having a first side and a second side; an electronic device on the first side; a heat sink in thermal communication with the electronic device, the heat sink extending to the second side of the anchor surface; and a spring clip holding the heat sink against the electronic device.

Another embodiment of the present invention provides an electronic assembly comprising: an anchor surface having a first side and a second side; an electronic device on the first side; means for heat sinking the electronic device in thermal communication with the electronic device and extending to the second side of the anchor surface; and means for holding the heat sink against the electronic device.

Another embodiment of the present invention provides a display system comprising: a light source for providing a beam of light along a light path; a display controller for providing image data; an anchor surface having a first side and a second side; spatial light modulator on the first side, the spatial light modulator on the light path and operable to modulate the beam of light in response to the image data; a heat sink in thermal communication with the spatial light modulator, the heat sink extending to the second side of the anchor surface; and a spring clip holding the heat sink against the spatial light modulator.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A new heat sink apparatus and method have been developed that greatly simplify the assembly of the heat sink and thermal stud. The new assembly process eliminates many assembly steps and their associated problems and opportunities for failure. The resulting apparatus is mechanically robust and exceeds the thermal performance requirements. The new heat sink assembly uses a spring retainer that, in most cases, can use existing spatial light modulator socket mounting screws. The new retainer satisfies electromagnetic interference, electrostatic discharge, grounding and insulation requirements. Additionally, the new heat sink mount is extremely reliable, eliminating part failures, product rejections, and returns.

Figure 1:
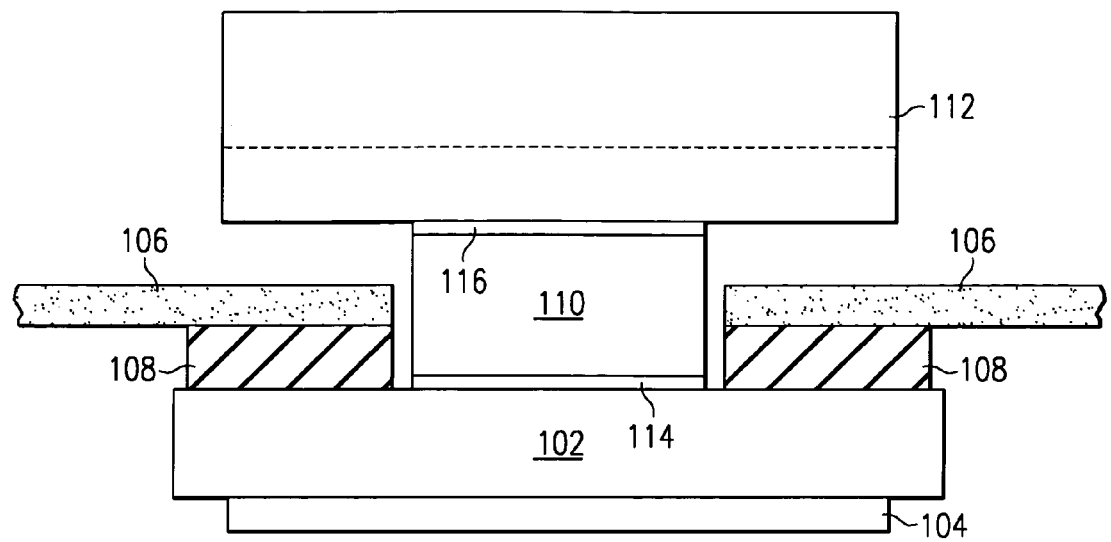
FIG. 1 is a side view of a thermal stud and heat sink attached to a digital micromirror package according to the prior art.
Figure 2:
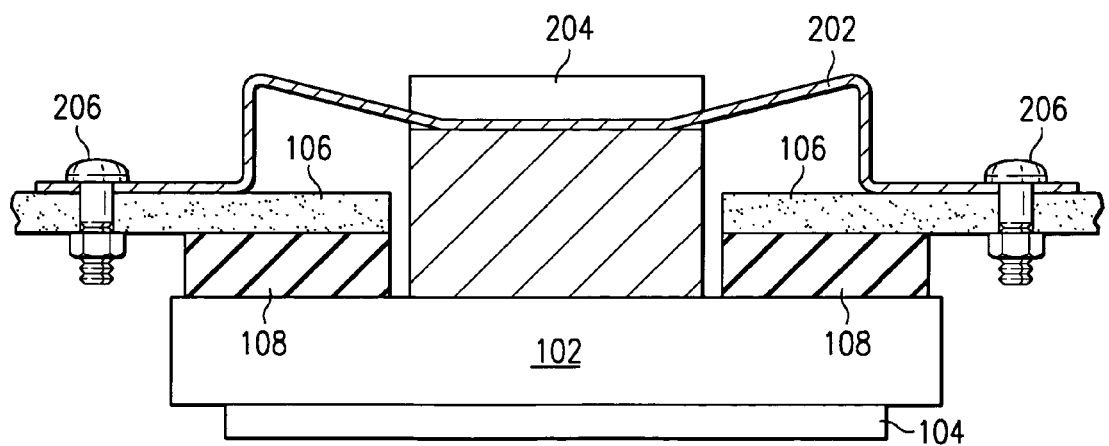
FIG. 2 is side view of a thermal stud attached to an electronic device using a spring clip of the present invention.

FIG. 2 is a cross section side view of a thermal stud attached to a digital micromirror illustrating one embodiment of the present invention. In FIG. 2, a spring clip 202 presses a thermal stud 204 against the back of an electrical device package 206. The thermal stud 204 may be any heat conductive material, and typically is aluminum. The electrical device package 102 typically houses a spatial light modulator such as a DMD or liquid crystal on silicon device. The package 206 shown in FIG. 2 uses an interposer 108 to provide electrical connection between the package 102 and the printed circuit board 106.

The spring clip 202 of FIG. 2 rests in a groove formed in the top surface of the thermal stud 204. The groove is not necessary to retain the thermal stud 204 since the printed circuit board 106 and interposer 108 restrain the thermal stud in two dimensions while the spring clip 202 and device package 102 restrain the thermal stud 204 in the third direction. Alternatively, screws or other fastening means such as adhesives, retaining fingers, slots, or channels, or mechanical fasteners may be used to attach the thermal stud 204 to the spring clip 202. The spring clip 202 of FIG. 2 is attached directly to the printed circuit board 106 by means of screws 208. A heat sink, not shown, may be attached to the thermal stud 204 by a variety of means including mechanical restraints and fasteners such as screws.

While the present invention will be described in terms of attaching the electronic device 102 to a printed circuit board 106, it should be understood that the term printed circuit board is intended to include any many other structures or types of anchor surfaces. For example, the electronic device 102 may be attached to a plastic or metal sheet, perhaps forming a reference plane to locate various other components or to provide additional thermal dissipation. If a metal sheet is used in place of the printed circuit board the interposer typically would be insulative or merely would serve to ground the electronic device. The only requirement is that the heat sink or thermal stud extend from the electrical component on one side of the printed circuit board through the printed circuit board to the thermal heat sink on the other side of the printed circuit board.

Figure 3:
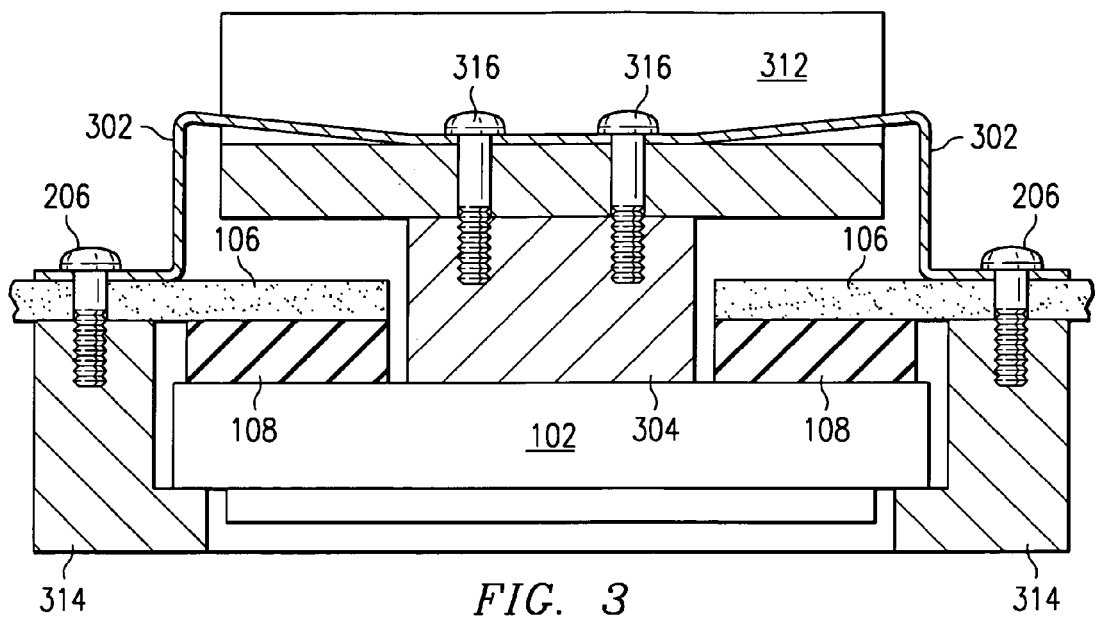
FIG. 3 is a side view of a thermal stud and heat sink attached to an electronic device using the spring clip of the present invention present invention anchored to a heat sink socket.

FIG. 3 is a cross section side view of a thermal stud 304 and heat sink 312 attached to a electrical device, shown as a digital micromirror device, using the spring clip 302 of the present invention present invention anchored to the heat sink socket 312. In FIG. 3, a socket 314 is shown on the front side of the printed circuit board 106. The screws 206 retaining the spring clip 302 extend through the printed circuit board 106 and engage the socket 314. The socket 314 has an open region through which light is allowed to enter and exit the window 104 on the top of the spatial light modulator package 102. Tension from the spring clip 302 is sufficient to provide good thermal contact between the thermal stud 304 and the package 102. Thermal grease, or thermally conductive tape may be used to improve the thermal conductivity between the package 102, thermal stud 304, and heat sink 312 in any of the embodiments of the present invention.

Figure 4:
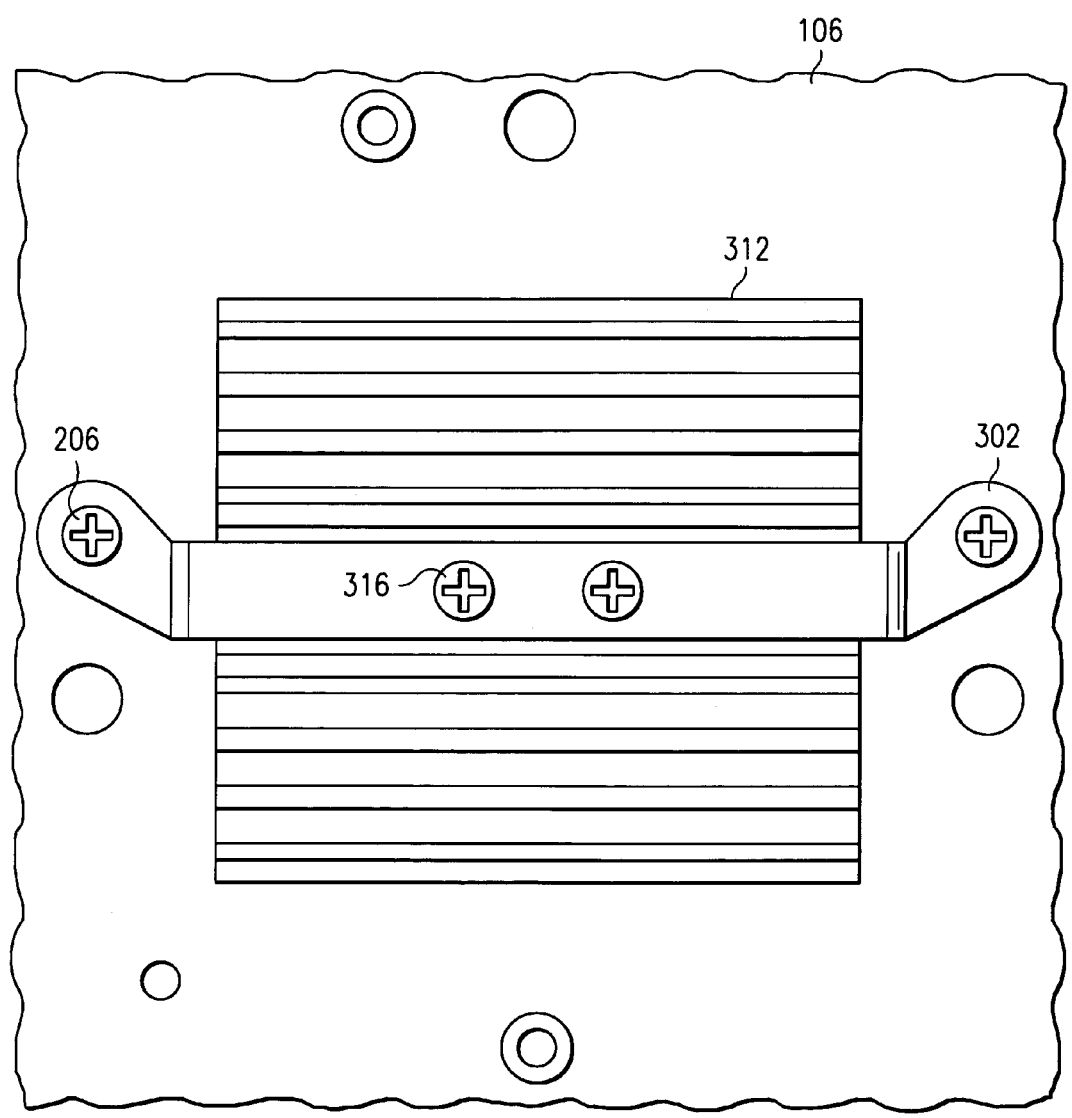
FIG. 4 is plan view of the heat sink attached to the electronic device using the spring clip of FIG. 3.

FIG. 4 is plan view of the heat sink and spring clip attached to the electronic device of FIG. 3. In FIG. 4, the two screws 206 used to attach the spring clip 302 to the heat sink 312 are optionally offset from the centerline of the spring clip 302.

Figure 5:
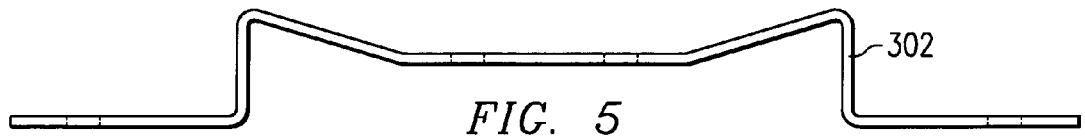
FIG. 5 is a side view of a clip according to one embodiment of the present invention.
Figure 6:
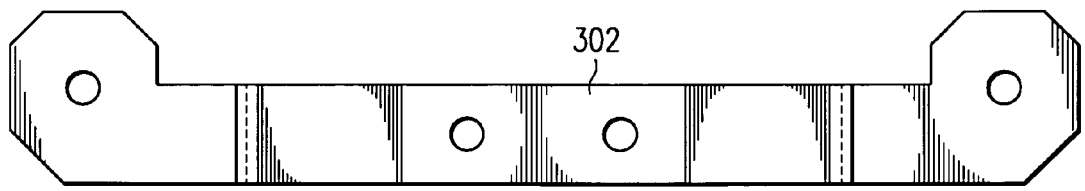
FIG. 6 is a plan view of a clip according to one embodiment of the present invention.

FIG. 5 is a side view of a spring clip 206 according to one embodiment of the present invention. FIG. 6 is a plan view of the spring clip 206. Assuming the flat spring load is calculated based on a standard beam formula and that the system can be assumed to be a cantilever load, the force exerted by the spring clip 206 is:

$$\text{Force} = \frac{Ebt^3 F}{4L^3}$$

where: E=Young's Modulus
F=Deflection
b=Width
L=Length
t=Thickness

The spring clip 206 of FIGS. 5 and 6 is 1075/1095 spring steel with a Young's Modulus of $11.6*10^6$. The spring clip 206 is 0.015 inches thick, 0.280 inches wide, and 0.390 inches long. When installed, there is a 0.133 inch deflection, resulting in a force of approximately 6.08 pounds. The force may be varied over a fairly wide range by changing the dimensions and materials used. Table 1 lists the force achieved by various combinations of deflection and spring thickness.

| Material Thickness | Deflection (Force) | | |
| --- | --- | --- | --- |
| 0.015" | 0.100" (4.6#) | 0.133" (6.08#) | 0.150" (6.87#) |
| 0.018" | 0.100" (7.9#) | 0.133" (10.5#) | 0.150" (11.8#) |
| 0.020" | 0.100" (10.9#) | 0.133" (14.4#) | 0.150" (16.3#) |

Figure 7:
FIG. 7 is a side view of a clip according to another embodiment of the present invention.
Figure 8:
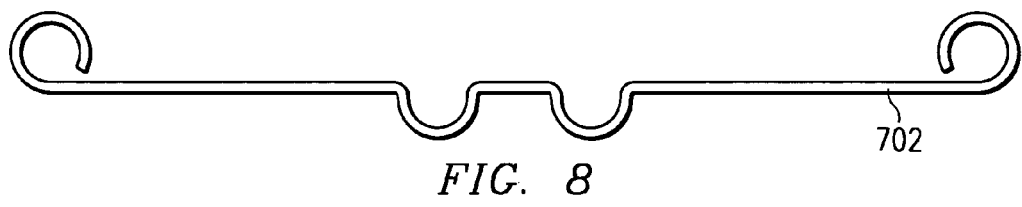
FIG. 8 is a plan view of a clip according to another embodiment of the present invention.

FIG. 7 is a side view of an alternative spring clip 702 according to another embodiment of the present invention. FIG. 8 is a plan view of the spring clip 702 of FIG. 7. Spring clip 702 is formed using music wire or other materials.

Figure 9:
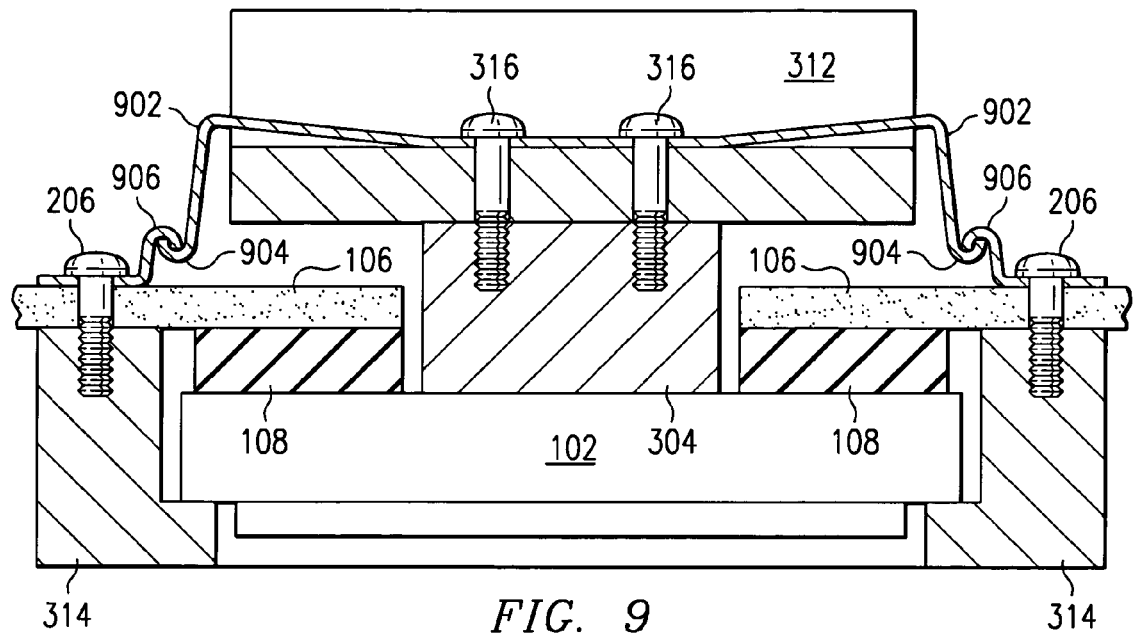
FIG. 9 is a cross section side view of a spring clip retainer according to another embodiment of the present invention.

FIG. 9 is a cross section side view of a spring clip 902 retainer according to another embodiment of the present invention. In FIG. 9, a spring clip 902 has hooks 904 on each end of the spring clip 902. The hooks 904 engage similar hooks 906 attached to the printed circuit board 106 or other reference structure.

Figure 10:
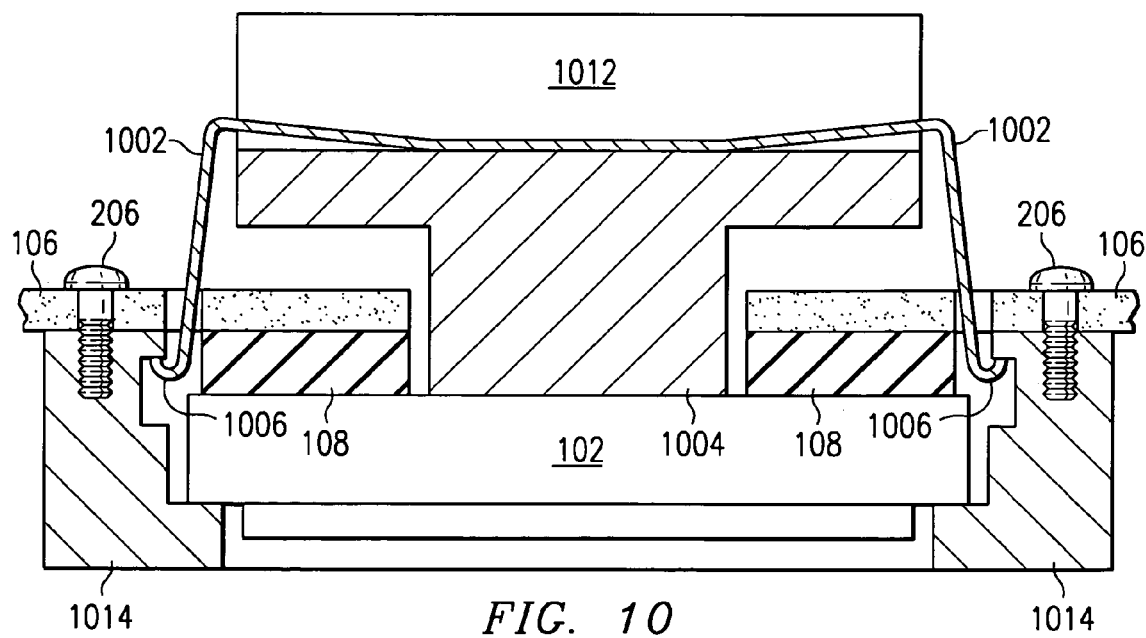
FIG. 10 is a cross section side view of a one piece thermal stud and heat sink held against an electronic package by a spring clip according to one embodiment of the present invention.

FIG. 10 is a cross section side view of a one piece thermal stud and heat sink 1004 held against an electronic package 102 by a spring clip 1002 according to one embodiment of the present invention. In FIG. 10, hooks 1006 formed in the ends of the spring clip engage the printed circuit board 106, or other reference structure, to hold the spring clip 1002 in place and to apply a force to the heat sink 1004.

Figure 11:
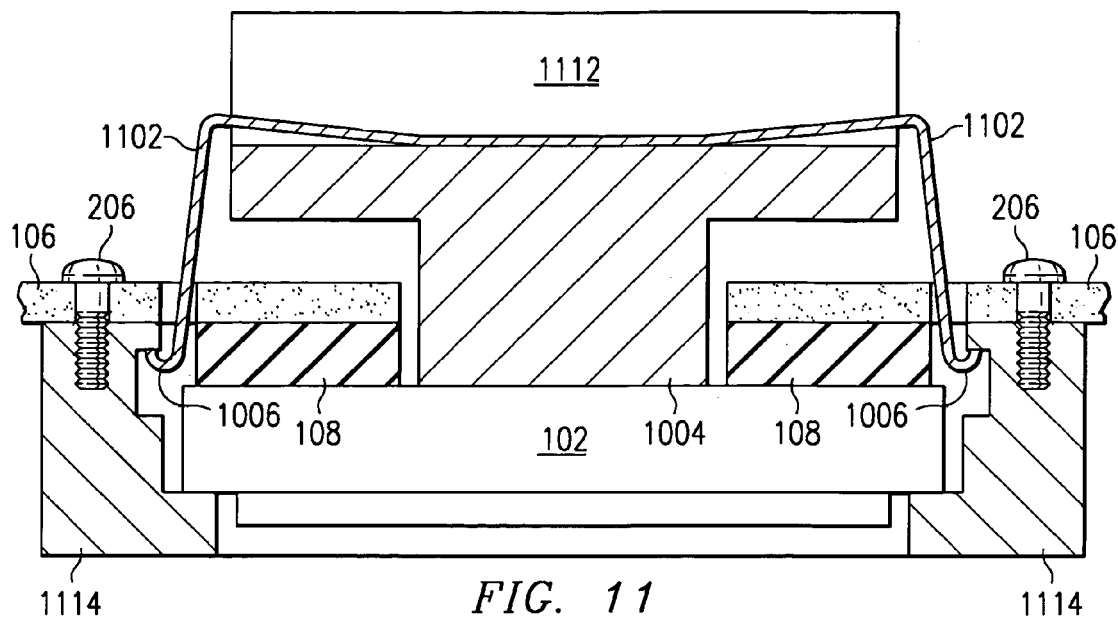
FIG. 11 is a cross section side view of a one piece thermal stud and heat sink held against an electronic package by a spring clip according to yet another embodiment of the present invention.

FIG. 11 is a cross section side view of a one piece thermal stud and heat sink 1004 held against an electronic package 102 by a spring clip 1102 according to yet another embodiment of the present invention. In FIG. 11, hooks 1106 formed in the ends of the spring clip engage the socket 1114 used to hold and align the electronic device 102. Depending on the application, retaining screws 206 may be eliminated and the entire assembly comprising the electronic device 102, the socket 1114, and the heat sink 1004 held in place by compression provided by the retaining spring clip 1102 and the interposer 108. In FIG. 11, some restraint would be required to prevent the socket from moving away from the printed circuit board 106 if the retaining screws were removed. This restraint could be provided by an additional bend in the retaining spring clip 1102 that would apply pressure to the heat sink side of the printed circuit board 106. Alternatively, the heat sink 1004 could be shaped to contact the printed circuit board, or a resilient member could be placed between the heat sink 1004 and the printed circuit board 106 to keep the socket 1114 pressed against the printed circuit board.

Figure 12:
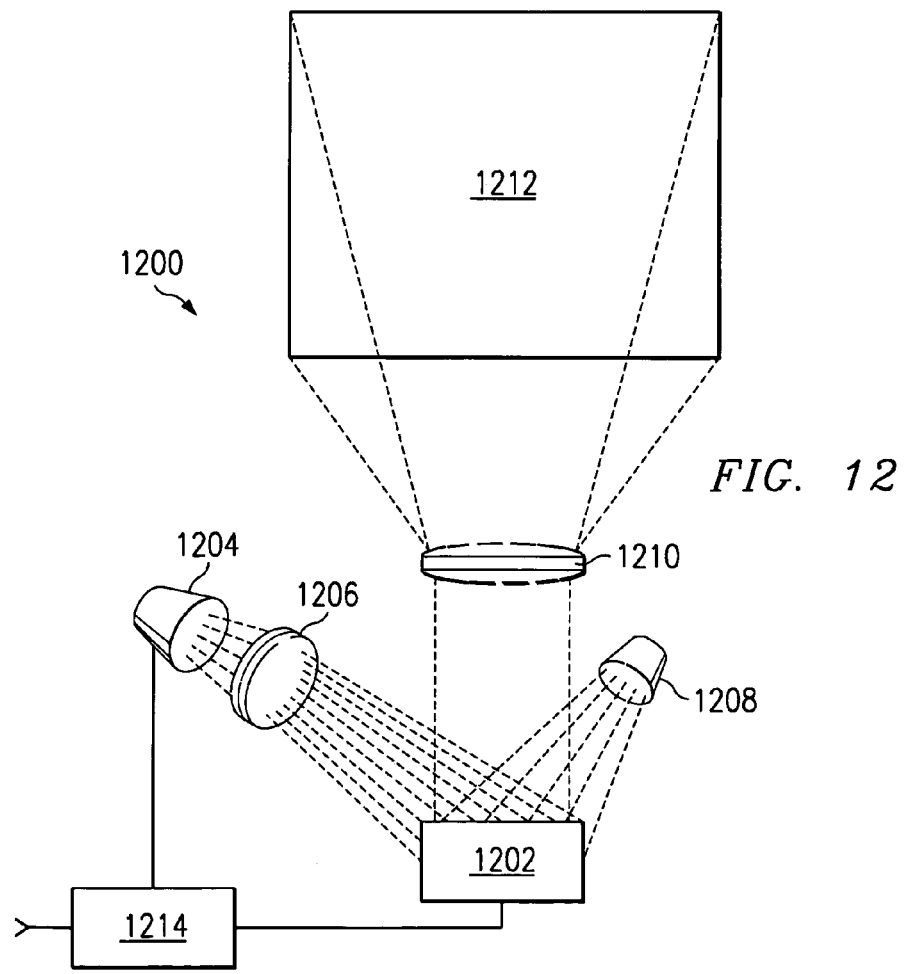
FIG. 12 is a schematic view of a micromirror-based projection system utilizing a thermal stud and heat sink attached to a micromirror device according to the present invention.

FIG. 12 is a schematic view of an image projection system 1200 using spatial light modulator 1202 in thermal communication with a heat sink as described above. In FIG. 12, light from light source 1204 is focused on the spatial light modulator 1202 by lens 1206. Although shown as a single lens, lens 1206 is typically a group of lenses and mirrors which together focus and direct light from the light source 1204 onto the surface of the spatial light modulator 1202. Image data and control signals from controller 1214 cause the modulator to selectively modulate in incident beam of light. In the case of a micromirror device, the image data and control signals cause some mirrors to rotate to an on position and others to rotate to an off position. Mirrors on the micromirror device that are rotated to an off position reflect light to a light trap 1208 while mirrors rotated to an on position reflect light to projection lens 1210, which is shown as a single lens for simplicity. Projection lens 1210 focuses the light modulated by the spatial light modulator 1202 onto an image plane or screen 1212.

Thus, although there has been disclosed to this point a particular embodiment for a heat dissipation attachment device and method therefore, it is not intended that such specific references be considered as limitations upon the scope of this invention except insofar as set forth in the following claims. It is intended that the features of the various embodiments, such as materials, structures, attachment means, types of thermal studs and heat sinks, be interchangeable to the greatest extent possible without departing from the express teachings of this disclosure. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. § 112, paragraph six.

What is claimed is:

1. A display system comprising:
   a light source for providing a beam of light along a light path;
   a display controller for providing image data;
   an anchor surface having a first side and a second side;
   spatial light modulator on said first side, said spatial light modulator on said light path and operable to modulate said beam of light in response to said image data;
   a heat sink in thermal communication with said spatial light modulator, said heat sink extending to said second side of said anchor surface; and
   a spring clip holding said heat sink against said spatial light modulator.

2. The display system of claim 1, wherein said heat sink comprising thermal stud and a heat sink.

3. The display system of claim 1, wherein said heat sink consisting of a thermal stud, a heat sink, and thermal interface material.

4. The display system of claim 1, wherein said spring clip attached to said anchor surface.

5. The display system of claim 1, further comprising a socket on said first side of said anchor surface, said spring clip attached to said socket.

6. The display system of claim 1, further comprising a socket on said first side of said anchor surface, said spring clip screwed to said socket.

7. The display system of claim 1, further comprising a socket on said first side of said anchor surface, said spring clip hooked to said socket.

8. The display system of claim 1, wherein said spring clip attached to said anchor surface.

9. The display system of claim 1, wherein said spring clip screwed to said anchor surface.

10. The display system of claim 1, wherein said spring clip hooked to said anchor surface.

11. The display system of claim 1, further comprising a hook on said first side of said anchor surface, said spring clip hooked to said hook.

* * * * *